United States Patent [19]

Wu

[11] Patent Number: 5,773,348
[45] Date of Patent: Jun. 30, 1998

[54] METHOD OF FABRICATING A SHORT-CHANNEL MOS DEVICE

[75] Inventor: Shye-Lin Wu, Hsinchu Hsien, Taiwan

[73] Assignee: Powerchip Semiconductor Corp., Hsin-Chu, Taiwan

[21] Appl. No.: 859,754

[22] Filed: May 21, 1997

[51] Int. Cl.$^6$ .................................................. H01L 21/336
[52] U.S. Cl. ......................... 438/305; 438/291; 438/301; 438/307
[58] Field of Search ................................... 438/305, 306, 438/307, 303, 301, 291, 174, 188, 199

[56] References Cited

U.S. PATENT DOCUMENTS

| | | | |
|---|---|---|---|
| 5,429,956 | 7/1995 | Shell et al. | 438/305 |
| 5,434,093 | 7/1995 | Chau et al. | 438/303 |
| 5,489,543 | 2/1996 | Hong | 438/305 |
| 5,534,447 | 7/1996 | Hong | 438/305 |
| 5,538,913 | 7/1996 | Hong | 438/307 |

OTHER PUBLICATIONS

Tanaka et al; "A Sub–0.1 $\mu$m Grooved Gate MOSFET with High Immunity to Short Channel Effects", IEDM, pp. 537–540, 1993.

"A 0.1 $\mu$m Inverted–Sidewall Recessed–Channel (ISRC) nMOSFET for High Performance and Reliability" J. Lyu et al., in the IEDM Tech. Dig., pp. 431–434, 1995.

Primary Examiner—Michael Trinh
Attorney, Agent, or Firm—Ladas & Parry

[57] ABSTRACT

A method of fabricating a short-channel MOS device on a substrate is provided. First, stacked pad oxide/nitride layers are formed on the substrate. Then a patterned photoresist film is formed on the planned gate region which covers the gate region and its sidewall spacers. A LPD (Liquid Phase Deposition) oxide is selectively deposited on the pad nitride layer by a liquid phase deposition process, except on the pre-formed photoresist film. After removing the photoresist layer nitride spacers leaning against the LPD oxide layer are formed by lithography and etching. The width of the nitride spacers controls the channel length of the MOS device. After forming a gate structure laterally sandwiched by the nitride spacers on the exposed substrate, a two-stage salicide process, which can form shallow junctions and self-aligned contacts on the source and the drain, is performed to complete the MOS device.

15 Claims, 6 Drawing Sheets

METHOD OF FABRICATING A SHORT-CHANNEL MOS DEVICE

BACKGROUND OF THE INVENTION

1. Field of the Invention

The present invention relates in general to a semiconductor process, and, more particularly, to a process for forming a MOS (metal-oxide-semiconductor) transistor having a ultra-short channel.

2. Description of the Related Art

The resolution limitation of photolithography is a critical issue in submicron or even deep-submicron semiconductor processes. Typically, the resolution limitation depends on the material of the photoresist used in the process, the wavelength of the lithographic light and the equipment performance. It is apparent that a slight deviation of any lithographic process parameter has a stronger impact on the submicron or deep-submicron device than before. Therefore, as the device dimensions continue to shrink, the product yield will be more sensitive to the parameters used in the lithographic process.

A conventional lithographic process used to define a gate region of MOS devices is described, to assist the understanding of the present invention. The gate of a MOS device includes a gate oxide layer and a doped polysilicon layer. Typically, the gate oxide layer has a thickness of 20 to 250 Å, which is made of high-quality oxide without contamination. The first step in forming the gate region of a MOS device involves forming a stacked gate oxide layer/ polysilicon layer on the substrate. Then, the stacked layers are patterned by a photolithographic process. Generally, the channel length of the MOS device is defined by the patterned gate oxide layer. It is apparent that the channel length is limited by the resolution of the photolithographic process that patterns the gate region.

Many methods of fabricating submicron MOS devices have been proposed to solve such a resolution problem. For example, an inverted-sidewall recess-channel NMOS device was disclosed in the article entitled "A 0.1 μm Inverted-Sidewall Recessed-Channel (ISRC) nMOSFET for High Performance and Reliability," J. Lyu et al., in the IEDM Tech. Dig., p431, 1995, the disclosure of which includes a method for fabricating an ISRC NMOS device. First, a 100 nm mask oxide, which exposes a region covering a planned channel and the LDD region, is formed on a substrate. Then, first inverted sidewall spacers, which are made of nitride and have a thickness of 150 nm, are formed within the unmasked region and lean against the mask oxide. After forming a recess gate oxide by a thermal process and removing the first inverted sidewall spacers, the shallow junction is formed by an implantation process. Finally, after re-growing second inverted sidewall spacers and forming the gate polysilicon layer, the mask oxide is removed.

However, there are some disadvantages in the process of fabricating the ISRC NMOS device as described above. First, when removing the thick mask oxide, there is no protection for the underlying substrate. As a result, the source and drain regions are damaged by the etching process. Second, the nitride spacers must be formed twice to build up the LDD structure. It is costly to implement such a fabrication process in the industry.

SUMMARY OF THE INVENTION

Therefore, an object of the present invention is to provide a method of fabricating a short-channel MOS device which can extend the limit of the current lithographic process.

Another object of the present invention is to provide a method of fabricating a short-channel MOS device which can prevent the substrate from being damaged by some etching processes.

Another object of the present invention is to provide a method of fabricating a short-channel MOS device which requires forming the nitride spacers only once.

The present invention achieves the above-indicated objectives by providing a novel method of fabricating a short-channel MOS device on a substrate. The method includes the following steps:

forming a stacked pad oxide layer/pad nitride layer on the substrate;

forming a photoresist layer on the pad nitride layer;

removing a portion of the photoresist layer by a lithographic process wherein the remainder portion of the photoresist layer covers a planned gate region of a gate of the MOS device and its sidewall spacers;

selectively depositing a LPD (liquid Phase Deposition) oxide layer on the pad nitride layer by a liquid phase deposition process at a temperature of between the ambient temperature and 110° C.;

removing the remainder portion of the photoresist layer;

forming nitride spacers within the gate planned region leaning against the LPD oxide layer while a portion of the pad nitride layer within the gate planned region is removed simultaneously;

removing a portion of the pad oxide layer within the planned gate region;

forming a gate structure of the MOS device on the exposed substrate, the gate structure being laterally sandwiched between the nitride spacers;

removing the LPD oxide layer by using the pad nitride layer as an etching stop layer;

removing the remainders of the pad nitride layer and the pad oxide layer;

depositing a refractory metal layer, such as titanium and cobalt, on the gate structure, the nitride spacers and the exposed substrate;

doping impurities into the refractory metal layer; and performing a thermal process to react the refractory metal layer with underlying silicon material to form self-aligned contacts, and to drivein the doped impurities to form shallow junction source and drain regions of the MOS device.

Accordingly, the channel length of the MOS device may be adjusted by the width of the nitride spacers under the condition of a fixed length of the planned gate region. In this case, the channel length can extend the resolution limitation of the photolithographic process, which indeed limits the length of the planned gate region.

In addition, the pad nitride layer, having a thickness of between 100 Å to 1000 Å, serves as an etching stop layer during the step of removing the LPD oxide layer and an anti-reflection coating layer during the exposure step of the photoresist layer.

In addition, a punchthrough stopping implantation on the substrate by using the LPD oxide layer as mask may be included, after the step of removing the remainder portion of the photoresist layer, to prevent the punchthrough phenomenon between the source and drain.

In addition, the gate structure may be formed by conventional techniques. More specifically, the polysilicon residues on the nitride spacers may be removed by additional steps.

First, the polysilicon material, resided in the polysilicon gate and the residues on the nitride spacers, is slightly oxidized by a thermal process. Then, the oxide may be removed in the step of removing the LPD oxide layer.

In addition, an additional step of forming lightly-doped areas of the source and the drain of the MOS device is performed after the step of removing the LPD oxide layer, to build up a LDD structure. In this case, the LDD structure may be implemented while the nitride spacers are formed only once.

Various other objects, advantages and features will become readily apparent from the following detailed description of the present invention, the novel features of the which will be particularly pointed out in the appended claims.

BRIEF DESCRIPTION OF THE DRAWINGS

The following detailed description, given by way of example and not intended to limit the invention solely to the embodiment described herein, will best be understood in conjunction with the accompanying drawings, in which.

DETAILED DESCRIPTION OF THE PREFERRED EMBODIMENT

Referring to FIGS. 1 to 11, a method of fabricating a MOS device on substrate 10 in accordance with the present invention is provided. In this embodiment, an NMOS device is formed, and therefore, substrate 10 is lightly doped with P-type impurities, such as boron. However, it is understood by those skilled in the art that PMOS devices can be fabricated in a similar manner. Field oxides 12 are then formed on substrate 10 by the conventional LOCOS process to isolate active regions on substrate 10.

Figure 1:
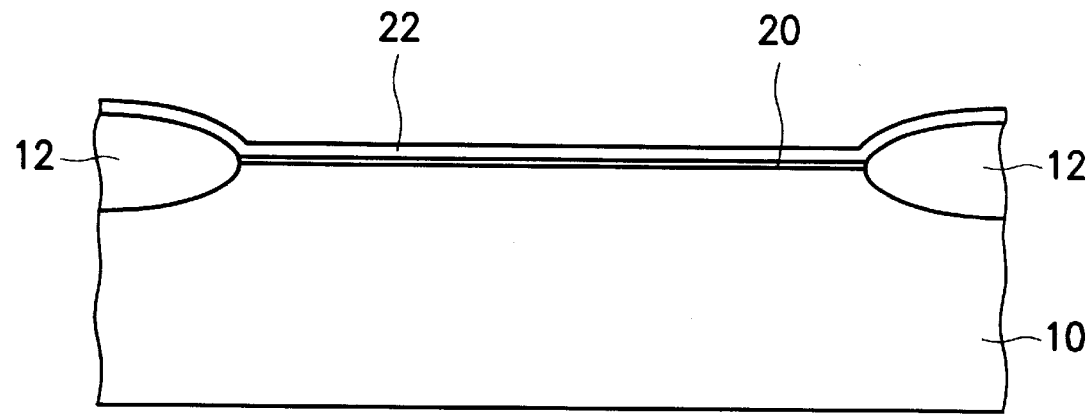
FIGS. 1 to 11 are cross-sectional views which illustrate the steps of the manufacturing method of a short-channel MOS device in accordance with the present invention.

Having the conventional formation in place, the manufacturing process of the present invention includes the following steps:

STEP 1:

Referring to FIG. 1, the first step of fabricating a short-channel MOS device is to form stacked pad oxide layer 20/pad nitride layer 22 on substrate 10. The forming of pad oxide 20 and pad nitride layer 22 may be achieved by a chemical vapor deposition (CVD) process or other similar techniques. Pad oxide layer 20, typically having a thickness of between 30 Å and 200 Å, is used to release the stress on substrate 10 produced by pad nitride layer 22. The stress directly applied by pad nitride layer 22 may cause defects on the surface of substrate 10, and, as a result, product yield will be reduced. Pad nitride layer 22, having a thickness of between 100 Å and 1000 Å in this embodiment, serves as an etching stop layer in the following step of removing the mask oxide layer and as an anti-reflection coating (ARC) layer in the photoresist exposure step, which will be described below in more detail.

Figure 2:
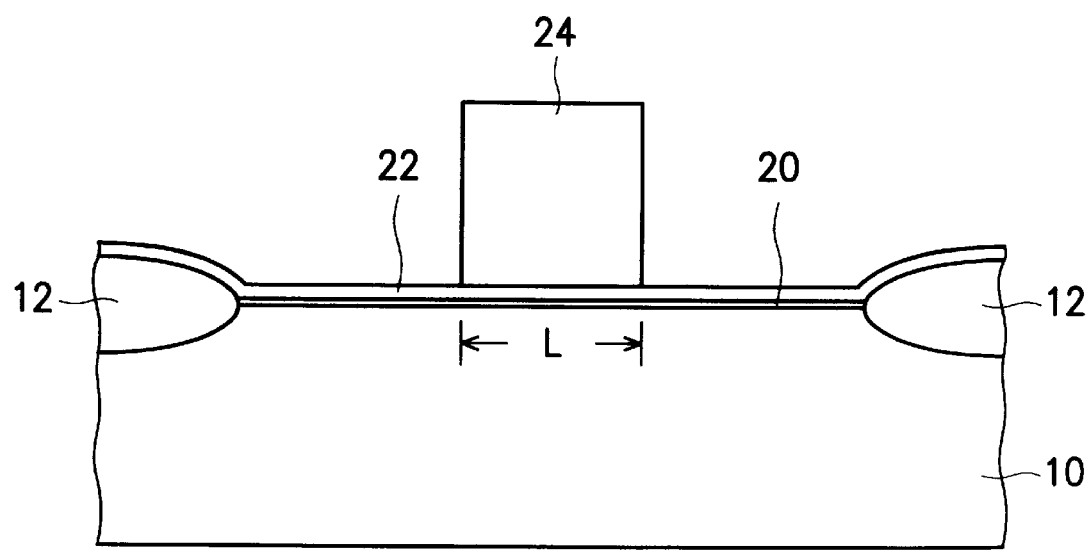

STEP 2:

Referring to FIG. 2, a photoresist layer is formed on pad nitride layer 22 and then defined as photoresist layer 24 by a mask. Photoresist layer remainder 24 covers a planned gate region with length L, which will include the gate of the MOS device and its sidewall spacers. Typically, photoresist layer 24 has a thickness of less than 0.5 μm. As described above, pad nitride layer 22 can be used as an antireflection coating layer during the photoresist exposure step, to enhance the accuracy of the exposure step.

Figure 3:
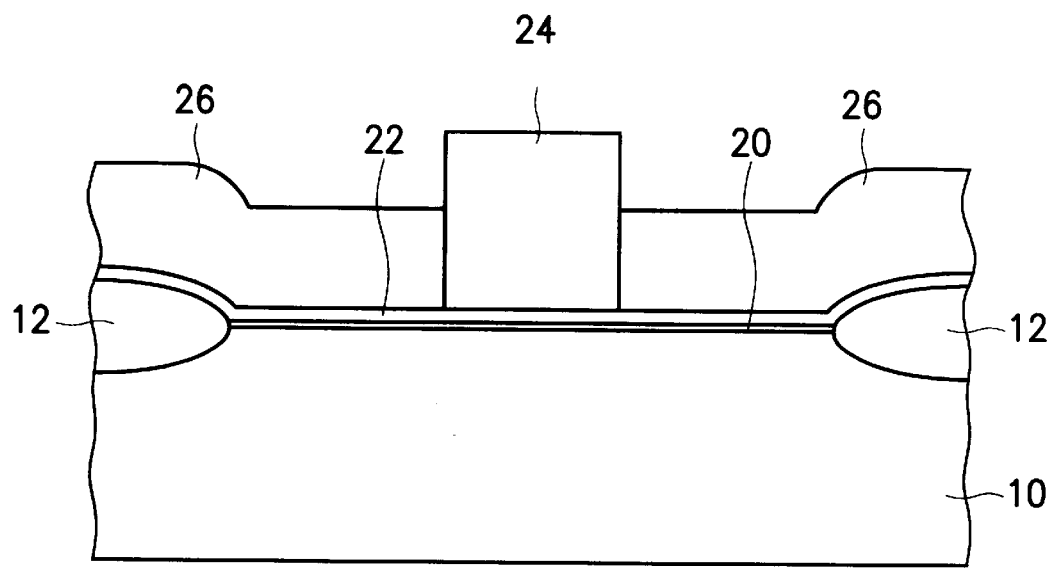
Figure 12:
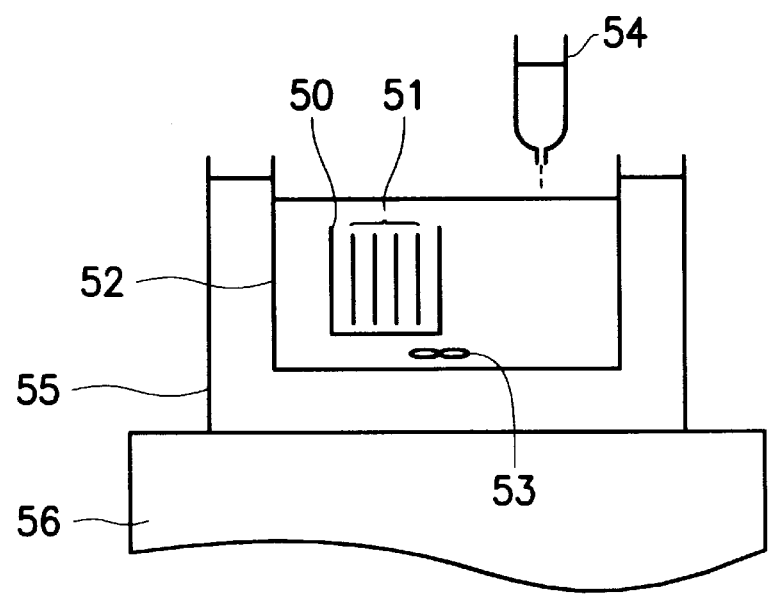
FIG. 12 shows a typical liquid phase deposition device used to form a LPD oxide on a substrate.

STEP 3:

Referring to FIG. 3, a LPD (liquid phase deposition) oxide layer 26 is selectively deposited on pad nitride layer 22, except for photoresist layer 24. Such LPD oxide layer 26 is performed by a liquid phase deposition device, as shown in FIG. 12. It includes reactor 52 containing hydrofluosilicic acid ($H_2SiF_6$) as a reactant, carrier 50 placed in reactor 52 for holding silicon wafers 51, stirrer 53 for stirring the reactant, injector 54 to add boric acid ($H_3BO_3$) into reactor 52 to keep the hydrofluosilicic acid saturated, water bath 55, and temperature controlled heater 56 used to maintain the temperature of water bath 55. The hydrofluosilicic acid ($H_2SiF_6$) is saturated with $SiO_2$ powder. It is known that the LPD oxide is selectively deposited, for example, on the nitride but not on the organic photoresist. In this embodiment, the liquid phase deposition process may be performed at a temperature of between the ambient temperature and 110° C., but can not extend over 140° C., which is the melting point of general photoresist material. In addition, the thickness of oxide layer 26 may be between 1000 Å and 5000 Å.

Figure 4:
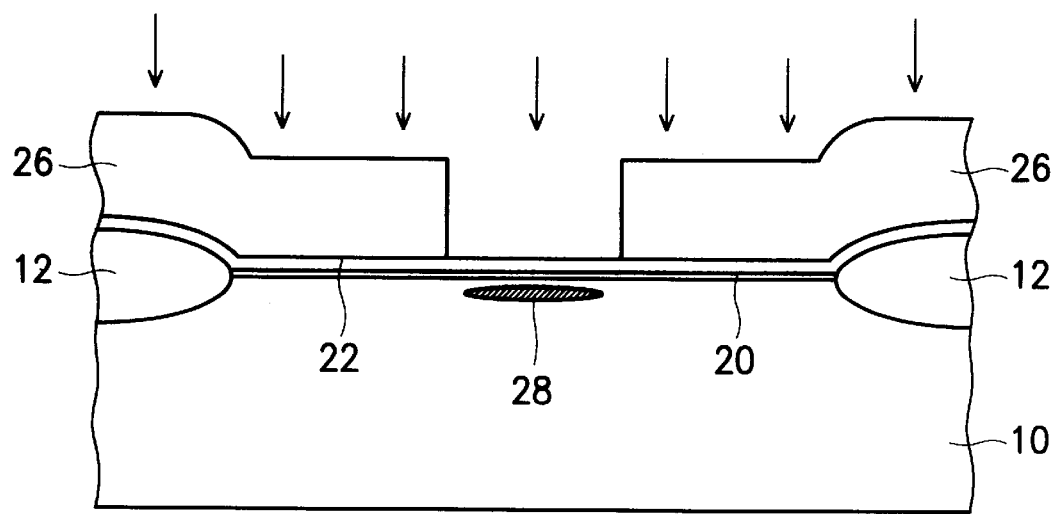

STEP 4:

Referring to FIG. 4, after removing photoresist layer 24 a punchthrough stopping implantation (sometimes referred to as anti-punchthrough implantation) is applied to substrate 10 by using LPD oxide layer 26 as an ion implantation mask, forming doped region 28 beneath the channel. The punch-through stopping implantation can build up a halo LDD structure which prevents the punchthrough effect between the source and the drain of a MOS device. In this embodiment, boron (B) or boron-difloride ion ($BF_2^+$) material is adoped as the dopant in the NMOS device case, with a doping energy of between 20 and 100 KeV and a dosage of between $5 \times 10^{11}$ atoms/cm$^2$ and $5 \times 10^{13}$ atoms/cm$^2$. It is understood by those skilled in the art that phosphorus (P) or arsenic (As) can be chosen as the dopant for a PMOS device under the same doping conditions.

Figure 5:
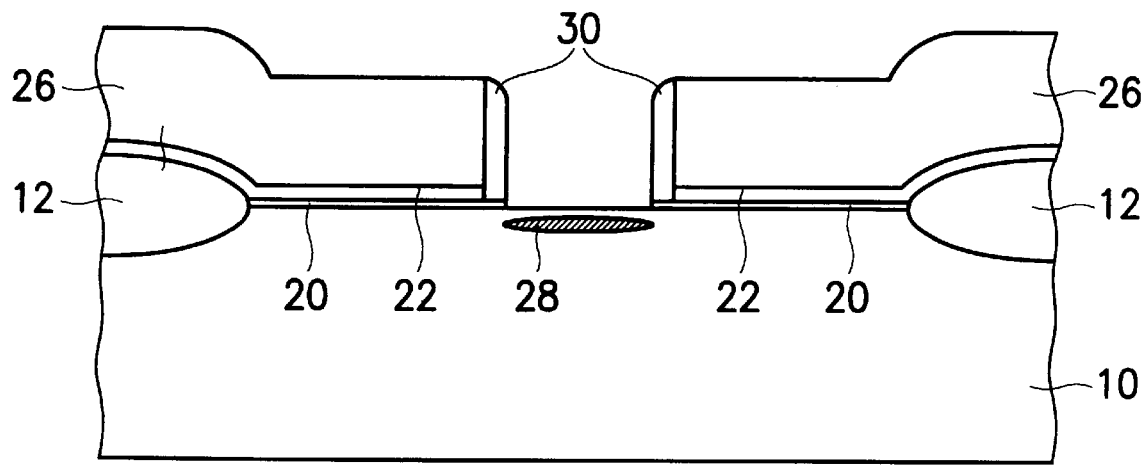

STEP 5:

Referring to FIG. 5, nitride spacers 30 are formed within the gate planned region by the conventional technique and lean against LPD oxide layer 26. The first step is to deposit a nitride layer on LPD oxide layer 26 and pad nitride layer 22 by a CVD process or other deposition techniques. As described above, the thickness of the nitride layer is a key parameter in deciding the actual channel length of the MOS device. In this embodiment, the thickness of the nitride layer is between 300 Å and 1500 Å. Then, the nitride layer is anisotropically etched to form nitride spacers 30, for example, by the conventional plasma etching. A portion of pad nitride layer 22 lying within the planned gate region may be removed in the same step. In addition, a portion of pad oxide layer 20 lying within the planned gate region is removed by conventional dry etching or wet etching, for example, by using the buffered HF solution.

Figure 6:
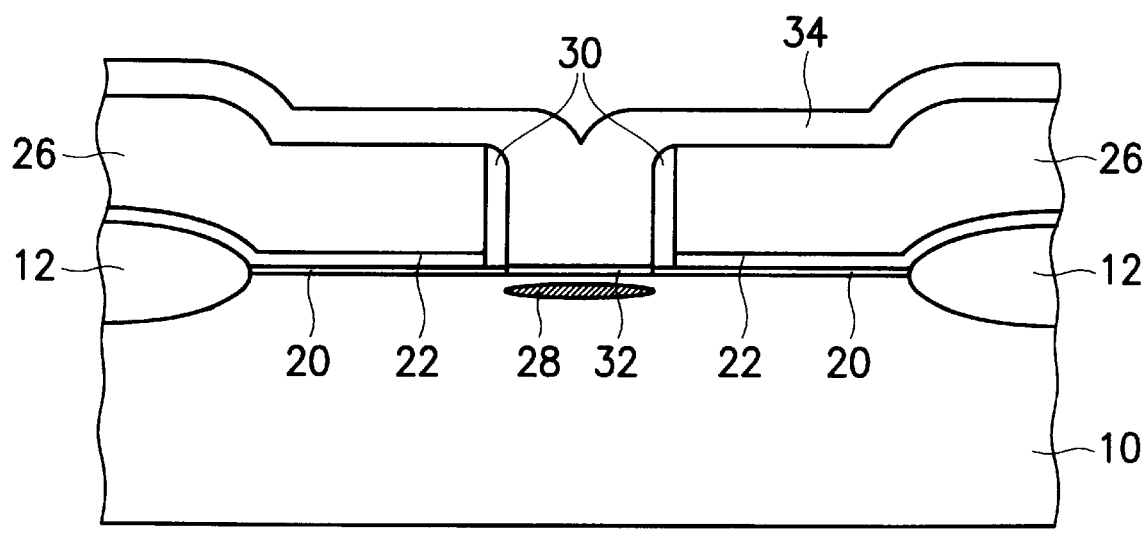
Figure 7:
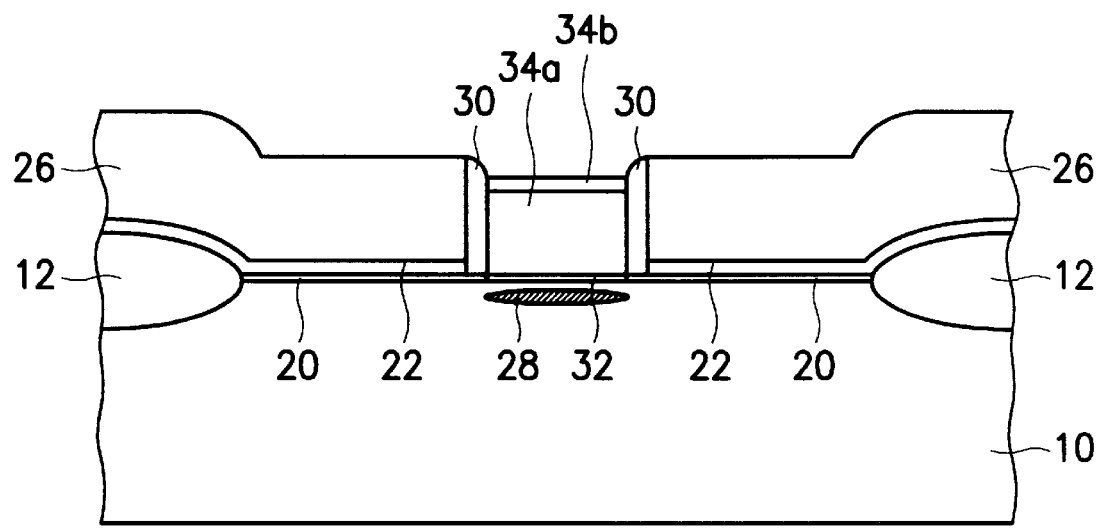
Figure 8:
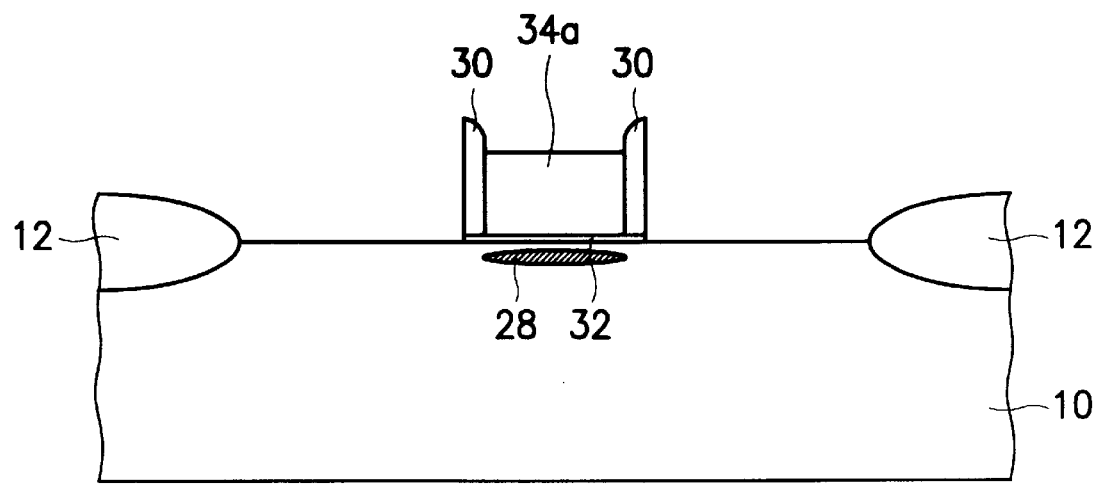

STEP 6:

FIG. 6 to FIG. 8 illustrate the formation of the gate structure of the MOS device in this embodiment. First, as shown in FIG. 6, a high-quality oxide layer 32 is grown on the exposed substrate surface. Gate oxide layer 32 generally is grown slowly and carefully by thermal dry oxidation in a chlorine ambient. The typical thickness of gate oxide layer 32 is about between 20 Å and 250 Å. The next step is to deposit amorphous silicon layer 34 on LPD oxide layer 26, nitride spacers 30 and gate oxide layer 32. The thickness of amorphous silicon layer 34 over LPD oxide layer 26 may be between 500 Å and 3000 Å. It should be noted that there is a groove in the surface of amorphous silicon layer 34 owing to the topology of the structure shown in FIG. 5. It is clear that increasing the thickness of amorphous silicon layer 34 can reduce the size of the groove. That is, amorphous silicon layer 34 must at least fill the space between nitride spacers 30.

The third step is to etch back amorphous silicon layer 34, for example, in mixtures of nitric acid ($HNO_3$) and hydrofluoric acid (HF), to form gate amorphous silicon layer 34a. Gate amorphous silicon layer 34a may be transformed into polysilicon by annealing processing, which may be an individual step or may be performed by the salicide (self-aligned silicide) process described later.

However, there may be silicon residues lying on the nitride spacers in the proceeding step. The residues will result in short circuiting between electrodes of the MOS device and should be removed. The fourth step involves slightly oxidizing the surface of gate amorphous silicon layer 34a to form oxide 34b, and therefore, the silicon residues on nitride spacers 30 are also oxidized. As a result, the oxide on nitride spacers 30 and oxide 34b may be removed by an individual wet etching process, or preferably, by the LPD oxide-removing process described later.

Finally, the fifth step is to remove LPD oxide layer 26, pad nitride layer 22 and pad oxide layer 20, as shown in FIG. 8. As described above, the oxide on nitride spacers 30 and oxide 34b are also removed during the removal of LPD oxide layer 26. In addition, the underlying pad nitride layer 22 may serve as an etching stop layer during the process of removing oxide layers and is removed in the following process. As a result, a gate structure, including gate oxide 32, gate amorphous silicon layer 34a (which will be transformed into polysilicon later) and nitride spacers 30, is formed. The channel length is roughly equal to the width of the gate layer, which is shorter than that of the planned gate region.

Figure 9:
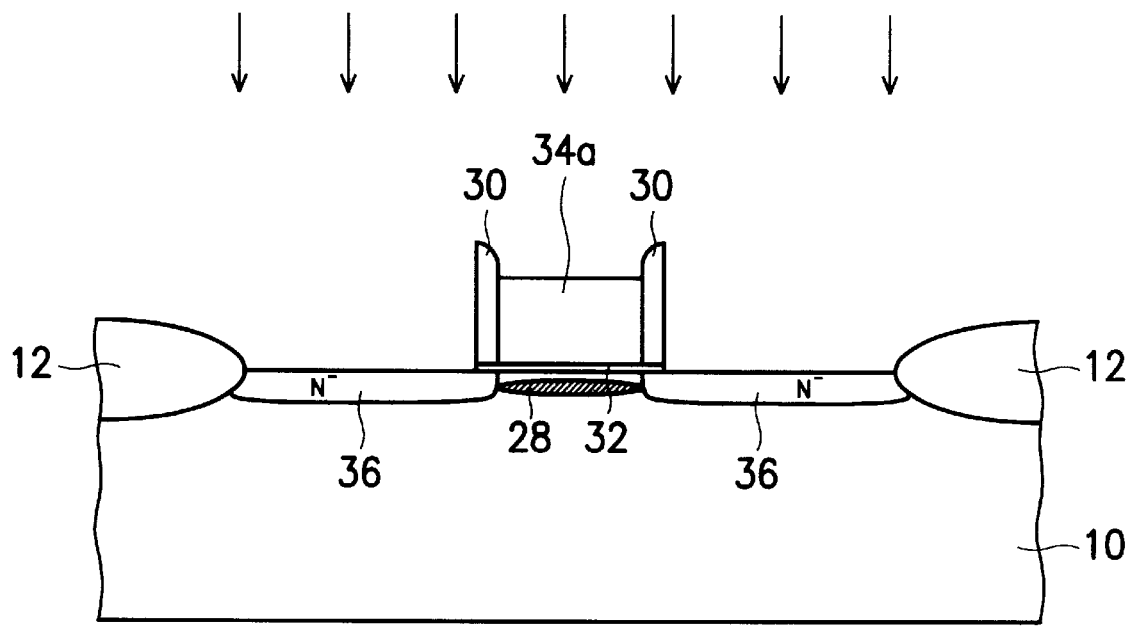

STEP 7:

Referring to FIG. 9, lightly-doped areas 36, lying in the source and the drain regions of the MOS device, are formed on exposed substrate 10 by a first implantation of a LDD process. In NMOS devices, this dose is normally $1 \times 10^{13}$ to $2 \times 10^{13}$ atoms/cm$^2$ of phosphorous. However, it is easily understood for those skilled in the art that the dose and the dopant can be adjusted in accordance with the practical application.

Figure 10:
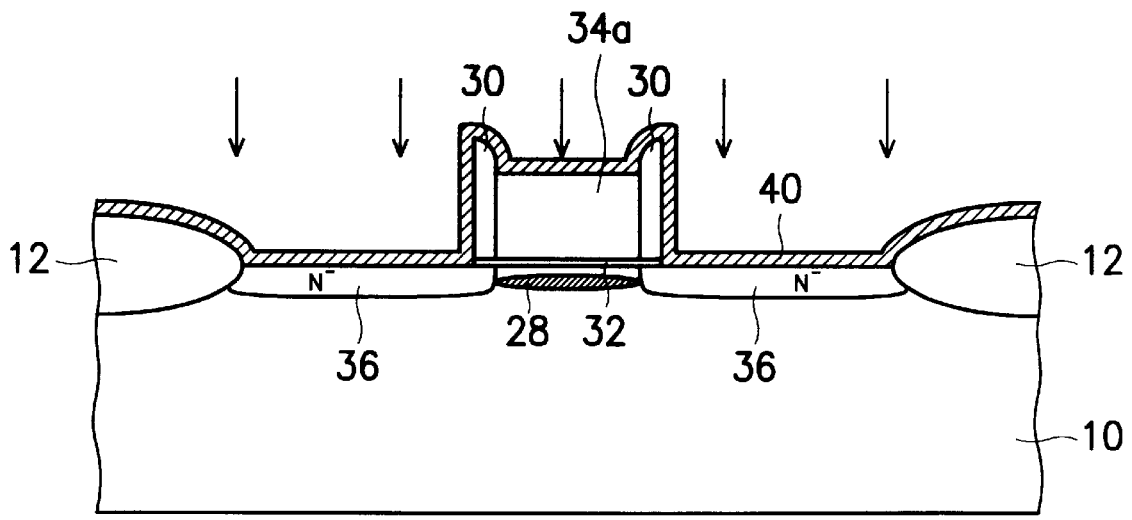
Figure 11:
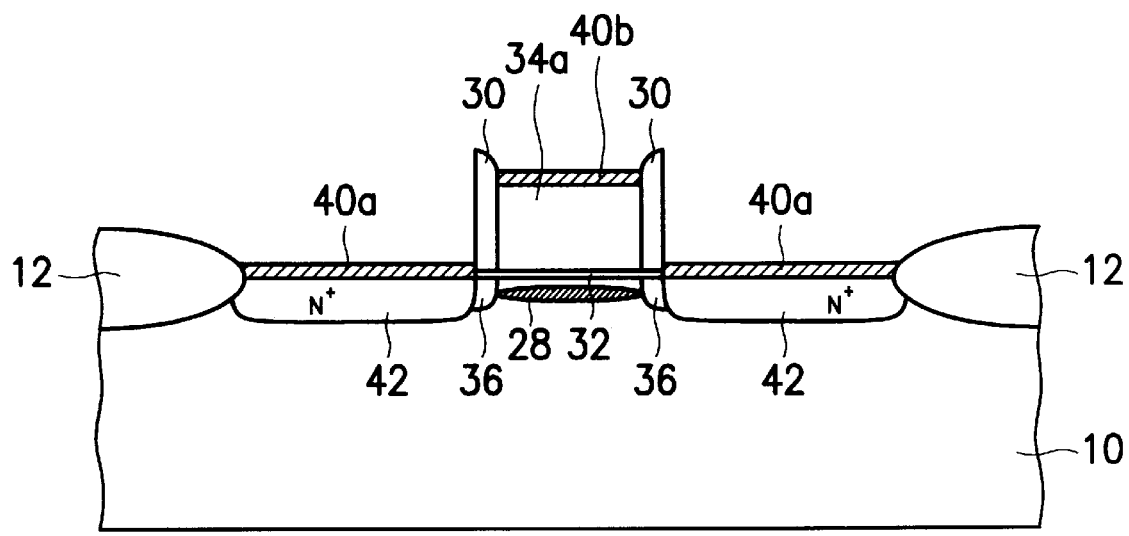

STEP 8:

FIG. 10 and FIG. 11 illustrate the formation of the heavily-doped areas of the source and the drain of the MOS device and the formation of the self-aligned contacts on the source and the drain. In FIG. 10, refractory metal film 40, which is made of titanium (Ti) or cobalt (Co), is deposited on the topology of the fabricated MOS device, especially on gate amorphous silicon layer 34a and on substrate 10. Refractory metal film 40 is used to form self-aligned contacts, that is, the heavily-doped regions. In this step, a shallow-junction implantation is applied to refractory metal film 40. For NMOS devices the typical dose is arsenic (As) and the implantation dosage is heavier than that of the implantation shown in FIG. 9. The dose atoms do not have enough energy to penetrate refractory metal film 40 and will be trapped therein. These trapped atoms will be driven into substrate 10 and gate amorphous silicon layer 34a in the following annealing step.

In FIG. 11, a two-stage annealing process is applied to refractory metal film 40 to form silicide 40a on the source and drain region and silicide 40b on the gate region, and the residual refractory metal on nitride spacers 30 is removed. Refractory metal film 40 can react with the underlying silicon material in a high-temperature ambient, to form conductive silicide material. Usually, the first stage is performed at a temperature of between 400° C. and 650° C. and the second stage is performed at a temperature of between 750° C. and 900° C. The purpose of the two-stage thermal processing is to lower the resistance of silicide. Meanwhile, there are two other purposes for the two-stage thermal process. The first one is to transform amorphous silicon 34a into polysilicon, which usually serves as the material of the gate electrode. The second one is to drive-in the trapped atoms implanted in FIG. 10 to form heavily-doped areas 42 of the source and the drain and to dope the transformed polysilicon gate 34a. As a result, a MOS device having a short channel in accordance with the present invention is completed.

In addition, it is understood by those skilled in the art that moving the implantation step shown in FIG. 10 between the two thermal annealing stages is possible.

The advantages of the present invention are described as follows:

1. The channel length of a MOS device, which is usually limited by lithographic resolution, can be extended by using nitride spacers. That is, the channel length can be adjusted by the width of the nitride spacers. Therefore, it is feasible to fabricate a ultra-short channel MOS device at low cost.
2. The pad nitride film is used to prevent the underlying semiconductor substrate from damage caused by removing the mask oxide (or the LPD oxide in the present invention). As a result, surface defects of the substrate can be reduced and product yield will increase.
3. The ultra-shallow source/drain junctions having low interconnection resistance are formed during the salicide process.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application. Others skilled in the art can implement the invention in various other embodiments and with various other modifications as are suited to the particular use contemplated. It is intended that the scope of the invention be defined by the following claims and their equivalents.

What is claimed is:

1. A method for fabricating a short-channel MOS device on a substrate, comprising the steps of:

forming a pad oxide layer on the substrate;

forming a pad nitride layer on the pad oxide layer;

forming a photoresist layer on the pad nitride layer;

removing a portion of the photoresist layer by a photolithographic process, a remainder portion of the photoresist layer covering a planned region for a gate of the MOS device and its sidewall spacers;

selectively depositing a LPD oxide layer on the pad nitride layer by a liquid phase deposition process;

removing a remainder portion of the photoresist layer;

forming nitride spacers within the planned gate region against the LPD oxide layer;

removing a portion of the pad oxide layer located within the planned gate region;

forming a gate structure of the MOS device on the exposed substrate, the gate structure being laterally sandwiched between the nitride spacers;

removing the LPD oxide layer by using the pad nitride layer as an etching stop layer;

removing remainders of the pad nitride layer and the pad oxide layer;

depositing a refractory metal layer on the gate structure, the nitride spacers and the exposed substrate;

doping impurities into the refractory metal layer; and performing a thermal process to react the refractory metal layer with underlying silicon material to form self-aligned contacts and to drive-in the doped impurities to form shallow junction source and drain regions of the MOS device.

2. The method of claim 1, wherein the pad nitride layer has a thickness of between 100 Å to 1000 Å.

3. The method of claim 1., wherein the LPD oxide layer on the pad nitride layer has a thickness of between 1000 Å and 5000 Å.

4. The method of claim 1, wherein the channel length of the MOS device is adjusted by the width of the nitride spacers under the condition of the fixed length of the planned gate region.

5. The method of claim 1, wherein the step of depositing the LPD oxide layer by the liquid phase deposition process is performed at a temperature of between the ambient temperature and 110° C.

6. The method of claim 1, wherein after the step of removing a remainder portion of the photoresist layer further comprising the step of applying a punchthrough stopping implantation into the substrate by using the LPD oxide layer as mask.

7. The method of claim 1, wherein the step of forming the nitride spacers includes the steps of:

depositing a nitride layer on the pad nitride layer within the planned gate region and the LPD oxide layer; and anisotropically etching the nitride layer to form the nitride spacers and to remove the pad nitride layer within the planned gate region.

8. The method of claim 1, wherein the step of forming the gate structure of the MOS device includes the steps of:

depositing a thin gate oxide layer on the exposed substrate;

depositing an amorphous silicon layer on the gate oxide layer, the nitride spacers and the LPD oxide layer;

etching back the amorphous silicon layer to form a gate amorphous silicon layer; and annealing the gate amorphous silicon layer to form a gate polysilicon layer.

9. The method of claim 8, wherein the step of annealing the gate amorphous silicon layer is performed simultaneously by the step of performing the thermal process to react the refractory metal layer.

10. The method of claim 8, wherein after the step of etching back the amorphous silicon layer to form the gate amorphous silicon layer further comprising the steps of:

slightly oxidizing a surface of the gate amorphous silicon layer so as to simultaneously oxidize amorphous silicon residues on the nitride spacers; and removing the oxide material on the gate amorphous silicon layer and the nitride spacers.

11. The method of claim 10, wherein the step of removing the oxide material is performed simultaneously by the step of removing the LPD layer.

12. The method of claim 1, wherein after the step of removing the LPD oxide layer further comprising a step of forming lightly-doped areas of the source and the drain of the MOS device.

13. The method of claim 1, wherein the refractory metal layer is made of titanium.

14. The method of claim 1, wherein the refractory metal layer is made of cobalt.

15. The method of claim 1, wherein the thermal process performed on the refractory metal layer is a two-stage process, in which the first stage is performed at a temperature of between 400° C. and 650° C. and the second stage is performed at a temperature of between 750° C. and 900° C.

* * * * *